United States Patent
Rockford et al.

(10) Patent No.: US 8,129,767 B2
(45) Date of Patent: Mar. 6, 2012

(54) FERROELECTRIC POLYMER MEMORY MODULE

(75) Inventors: Lee D. Rockford, Portland, OR (US); Ebrahim Andideh, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/874,124

(22) Filed: Sep. 1, 2010

(65) Prior Publication Data

US 2011/0073831 A1    Mar. 31, 2011

Related U.S. Application Data

(62) Division of application No. 10/951,017, filed on Sep. 27, 2004, now Pat. No. 7,808,024.

(51) Int. Cl.
*H01L 29/76* (2006.01)

(52) U.S. Cl. ......... 257/295; 257/E27.104; 257/E21.663; 257/E21.664; 438/3

(58) Field of Classification Search .................. 257/295, 257/E27.104, E21.663, E21.664; 438/3
See application file for complete search history.

(56) References Cited

U.S. PATENT DOCUMENTS

| | | | |
|---|---|---|---|
| 2003/0179617 A1 | 9/2003 | Gudesen et al. | |
| 2003/0206434 A1 | 11/2003 | Leuschner | |
| 2003/0224535 A1 | 12/2003 | Andideh et al. | |

FOREIGN PATENT DOCUMENTS

| | | |
|---|---|---|
| KR | 1020030059272 | 7/2003 |
| WO | WO 2002/043071 | 5/2002 |
| WO | WO 2003/041084 | 5/2003 |
| WO | WO 03044801 | 5/2003 |
| WO | WO 2003/046924 | 6/2003 |
| WO | WO 2003/046995 | 6/2003 |
| WO | WO 2006/036691 | 4/2006 |

OTHER PUBLICATIONS

International Preliminary Report on Patentability from PCT Application No. PCT/US2005/033811, mailed Mar. 27, 2007, 7 pgs.
Office Action from Korean Patent Application No. 2007-7006973 mailed Aug. 13, 2008, 4 pgs.
First Office Action from Korean Patent Application No. 2007-7006973, mailed Feb. 15, 2008, 2 pgs.
International Search Report for PCT Application No. PCT/US2005/033811, mailed Jun. 21, 2006, 3 pgs.
First Office Action from Chinese Patent Application No. 200580032639.7, mailed Sep. 5, 2008, 28 pgs.
Office Action from Korean Patent Application No. 2007-7006973 mailed Jan. 23, 2009, 6 pgs.

(Continued)

*Primary Examiner* — Andy Huynh
(74) *Attorney, Agent, or Firm* — Blakely, Sokoloff, Taylor & Zafman LLP (57) ABSTRACT

Ferroelectric polymer memory modules are described. In an example, a module has a first set of layers including a first ILD layer defining trenches therein, a first electrode layer disposed in the trenches of the first ILD layer, a first conductive polymer layer disposed on the first electrode layer and in the trenches of the first ILD layer, and a ferroelectric polymer layer disposed on the first conductive polymer layer, in and extending beyond the trenches of the first ILD layer. The module also has a second set of layers disposed on the first set of layers to define memory cells therewith. The second set of layers includes a second ILD layer defining trenches therein, a second conductive polymer layer disposed in the trenches of the second ILD layer, and a second electrode layer disposed on the second conductive polymer layer.

7 Claims, 7 Drawing Sheets

OTHER PUBLICATIONS

Office Action from German Patent Application No. 112005002299.4-33 mailed Apr. 14, 2009, 6 pgs.

Written Opinion from PCT Application No. PCT/US2005/033811, mailed Mar. 27, 2007, 6 pgs.

Decision on Rejection from Chinese Patent Application No. 200580032639.7 mailed Jun. 5, 2009, 22 pgs.

Non-Final Office Action for U.S. Appl. No. 10/951,017, mailed Nov. 10, 2009, 19 pgs.

Notification to Grant from Chinese Patent Application No. 200580032639.7, mailed Dec. 8, 2011, 5 pages.

Office Action from Japanese Patent Application No. 2007-533606, mailed Jan. 25, 2011, 3 pages.

FERROELECTRIC POLYMER MEMORY MODULE

CROSS-REFERENCE TO RELATED APPLICATIONS

This application is a divisional of U.S. patent application Ser. No. 10/951,017, filed Sep. 27, 2004, the entire contents of which are hereby incorporated by reference herein.

FIELD

Embodiments of the present invention relate to ferroelectric polymer memory devices and to methods of fabricating those devices.

BACKGROUND

Ferroelectric devices such as ferroelectric polymer memory devices may comprise one or more layers of ferroelectric material sandwiched between layers of electrodes. Methods of formation of devices such as ferroelectric polymer memory devices may vary, but one method may comprise depositing a layer of ferroelectric polymer on a first electrode layer, and then depositing and patterning a second electrode layer on a substantial portion of the ferroelectric polymer layer.

The prior art uses subtractive metal integration schemes in order to form polymer memory devices. Subtractive metal integration requires first blanket deposition of a metal layer, followed by photoresist spin/expose/develop, then metal etch, then resist removal, then a wet clean. Patterning of conductive polymer subtractively on top of metal poses a number of disadvantages. First, while photoresist can be spin cast upon, developed upon, and chemically removed by wet or dry process techniques from a blanket metal, the same is not true of a blanket conducting polymer layer. For example, if the conducting polymer is soluble in the solvent that is used to spin cast the photoresist, then, during the photoresist spin process on top of a layer of blanket metal covered by a layer of blanket conducting polymer, the photoresist solution will simply rinse the conducting polymer off. However, even if an appropriate conducting polymer is chosen so as not to be soluble in photoresist solvent, and a layer of photoresist could be spin cast on top of the conductive polymer without damaging it, chemical development of the UV exposed photoresist would destroy the conducting polymer in the areas where the developer dissolved the polymer. This is because of the chemical process used in exposing and developing chemically amplified photoresists. UV light disintegrates acid groups in the photoresist making light-exposed sections dissolvable in a basic solution of TMAH (tetramethylammoniumhydroxide). Once this base solution has rinsed off the UV exposed photoresist regions, the conducting polymer below would be exposed to the base solution. Conducting polymers are acid doped, and therefore the developer TMAH would either de-dope the polymer by neutralizing the doping acids, or simply dissolve the polymer entirely, even undercutting the photoresist that was not developed, thus removing all of the conducting polymer from the substrate. Finally, even assuming that means existed for circumventing the disadvantages set forth above, in the end, there would be patterned conducting polymer only on top of patterned metal, this being insufficient because the patterned metal line sidewalls would be left exposed to the ferroelectric polymer that is subsequently spin cast on the patterned substrate. The ferroelectric polymer and the metal on the sidewalls would chemically react, damaging the ferroelectric polymer.

A need, therefore, exists for an improved method of forming a ferroelectric polymer memory device that addresses at least some of the above concerns.

BRIEF DESCRIPTION OF THE DRAWINGS

The subject matter regarded as embodiments of the claimed subject matter is particularly pointed out and distinctly claimed in the concluding portion of the specification. Embodiments of the claimed subject matter, however, both as to organization and method of operation, together with objects, features, and advantages thereof, may best be understood by reference to the following detailed description when read with the accompanying drawings in which:

FIGS. 3j"-3p" are cross-sectional views of final stages of fabrication of a ferroelectric memory module according to a second embodiment of the present invention;

DETAILED DESCRIPTION

Embodiments of the claimed subject matter may comprise a method of fabricating a ferroelectric memory module with conducting polymer electrodes, a ferroelectric memory module fabricated according to the method, and a system incorporating the ferroelectric memory device.

In the instant description, any reference to "one embodiment" or "an embodiment" means that a particular feature, structure, or characteristic described in connection with the embodiment is included in at least one embodiment of the claimed subject matter. The appearances of the phrase "in one embodiment" in various places in the specification are not necessarily all referring to the same embodiment.

Numerous specific details may be set forth herein to provide a thorough understanding of the embodiments of the claimed subject matter. It will be understood by those skilled in the art, however, that the embodiments of the claimed subject matter may be practiced without these specific details. In other instances, well-known methods, procedures, components and circuits have not been described in detail so as not to obscure the embodiments of the claimed subject matter. It can be appreciated that the specific structural and functional details disclosed herein may be representative and do not necessarily limit the scope of the claimed subject matter.

It is to be noted that, in the instant description, a "memory module" or "module" refers to a component of a memory device or system, the component including one or more memory cells. According to the instant description, a single module could make up a memory device, or a stacking of multiple modules could make up a memory device. In addition, in the instant description, a "layer" may include one or more layers having a specific function. For example, an "ILD layer" may include one layer of an ILD material, a plurality of layers (or stack) of the same ILD material or of different ILD material, as long as the resulting structure is a "layer" having the function of an ILD.

Advantageously, embodiments of the present invention use a damascene integration scheme where an ILD is patterned and filled with active material, such as metal lines, a conductive polymer layer, and a ferroelectric polymer layer. By patterning the ILD, one avoids the disadvantages associated with having to pattern a metal layer and a conductive polymer layer that are in contact with one another.

Figure 1A:
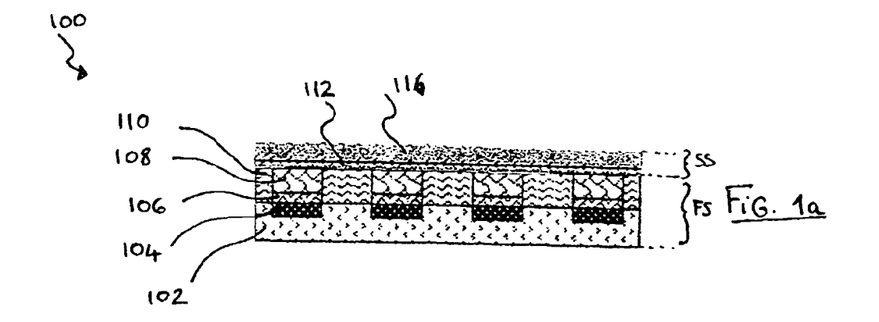
FIGS. 1a and 1b are cross-sectional views of a ferroelectric memory module according to a first embodiment of the present invention.
Figure 1B:
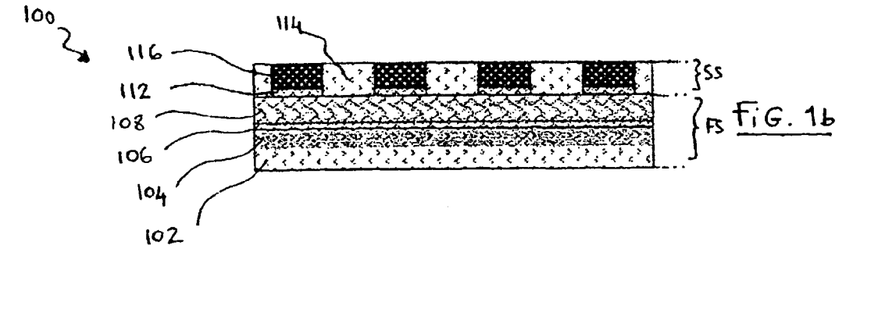

Referring next to FIGS. 1a and 1b, a ferroelectric memory module 100 is shown in accordance with a first embodiment of the claimed subject matter. FIGS. 1a and 1b are cross-sectional views of ferroelectric memory module 100 respectively depicting cross sections at sides disposed at 90 degrees with respect to one another.

As best seen in FIG. 1a, module 100 includes a first ILD layer 102, such as, by way of example, comprises Silicon Oxide ($Si_xO_y$), Silicon oxy-fluoride ($Si_xO_yF_z$), Silicon oxy-nitride ($Si_xO_yN_z$), Silicon Nitride ($Si_xN_y$), Nitrogen doped Silicon Carbide ($Si_xC_yN_z$), Silicon Caribe ($Si_xC_y$), Polymers ($C_vH_wF_xO_yN_z$). ILD layer 102 may be formed, by way of example, using well known deposition processes, such as chemical vapor deposition (CVD), sputter deposition, plasma vapor deposition (PVD), or spin casting from solution, followed by lithography and etch techniques. Formed on ILD 102 is first electrode layer 104. The first electrode layer 104 may, by way of example, comprise titanium nitride (TiN) or tantalum nitride (TaN), or composites of various metals and alloys of Ti, Ta, Ni, Al, Cu, Au, Ag, Pt, and may be formed using well known deposition processes, such as CVD, sputtering, PVD, atomic layer deposition (ALD), electroplating, or electro-less plating, followed by a damascene process, or chemical mechanical polishing (CMP). Formed on at least a portion of the ILD layer 102 and first electrode layer 104 is a first conductive polymer layer 106. First conductive polymer layer 106 may comprise Poly (ethylene-dioxythiophene) (PEDOT), Poly Pyrrole (PPY), Poly (aniline) PANI, or any available conducting polymer with a resistivity below $1 \times 10^5$ ohm-cm, and may be formed, by way of example, using well known spin deposition processes followed by a dry etch to reduce the thickness of the polymer layer. Disposed above conductive polymer layer 106 is a ferroelectric polymer layer 108, which may comprise a copolymer of vinyledene fluoride (VDF) and triflouroethylene (TrFE), or other organic spin-processable ferroelectric polymer such as pure poly VDF. Layer 108 may, by way of example, be deposited by well known spin deposition processes, followed by etch, and may, in one embodiment, have its thickness be reduced by a subsequent dry etch as will be explained in further detail below. Additionally provided on first ILD layer 102 is a second ILD layer 110, which may include the same materials and be formed in the same manner as ILD layer 102.

Referring next to FIG. 1b, a second conductive polymer layer 112 is shown as having been provided on layer 108. Layer 112, may, by way of example, be formed in the same manner as conductive polymer layer 106, and be made of the same material/materials. Above ferroelectric polymer layer 108 is a second electrode layer 116, which may, by way of example, be made of same materials and deposited in same manner as layer 104, the deposition process being followed by a damascene process, or chemical mechanical polishing (CMP). Also disposed above layer 108 is a third ILD layer 114, which may be formed in the same manner as ILD layers 102 and 110. By way of example, ILD layer 114 may include the same materials as those listed for ILD layers 102/110 above. Layer 114 may be patterned through lithography, etch and clean, again similar to layers 102/110.

Figure 2A:
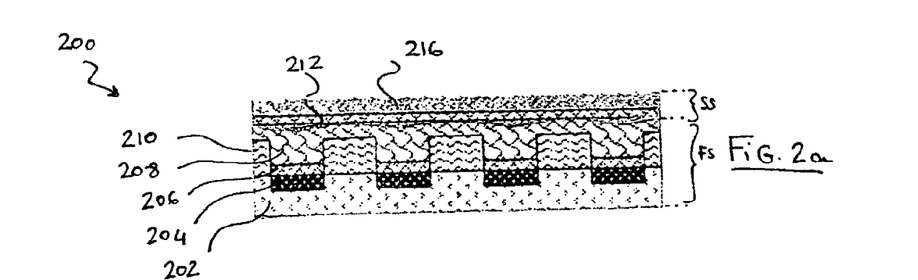
FIGS. 2a and 2b are cross-sectional views of a ferroelectric memory module according to a second embodiment of the present invention.
Figure 2B:
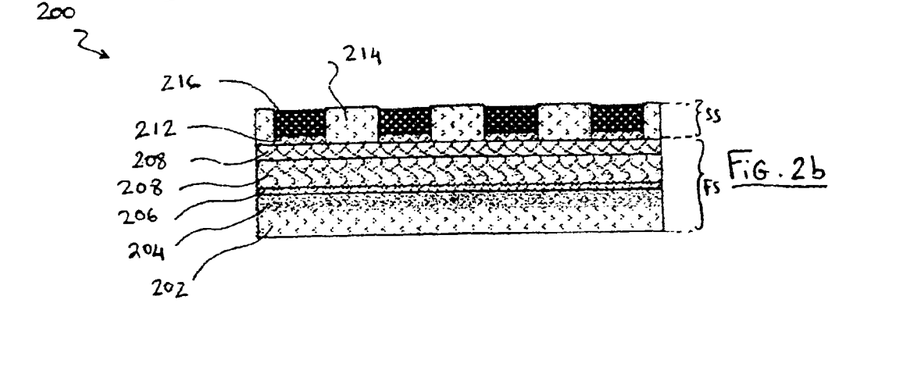

Referring next to FIGS. 2a and 2b, a ferroelectric memory module 200 is shown in accordance with a second embodiment of the claimed subject matter. FIGS. 2a and 2b are, similar to FIGS. 1a and 1b, elevational cut-away views of ferroelectric memory module 200 respectively depicting cut-aways at sides disposed at 90 degrees with respect to one another. A difference between the first embodiment of the present invention as depicted in FIGS. 1a and 1b on the one hand, and the second embodiment of the present invention as depicted in FIGS. 2a and 2b on the other hand, is that the ferroelectric polymer layer in the first embodiment does not extend beyond trenches defined by the second ILD layer 110. For example, the ferroelectric polymer layer in the first embodiment may be etched before deposition of the third ILD layer 114, whereas the ferroelectric polymer layer in the second embodiment does extend beyond trenches defined by the second ILD layer 210 (the ferroelectric polymer layer is not removed, such as by etching), as will be explained in further detail below.

Referring then to FIG. 2a, module 200 includes a first ILD layer 202, a first electrode layer 204 formed on the ILD layer 202. Also formed on at least a portion of the ILD layer 202 and first electrode layer 204 is a first conductive polymer layer 206. Disposed above conductive polymer layer 206 is a ferroelectric polymer layer 208. Additionally provided on first ILD layer 202 is a second ILD layer 210. Layers 202, 204, 206 and 210 may, respectively, comprise the same materials and be made in the same manner as layers 102, 104, 106 and 110 described above in relation to the first embodiment of the present invention as depicted in FIGS. 1a and 1b. In addition, ferroelectric polymer layer 208 may be made of the same materials and may be deposited in the same manner as ferroelectric polymer layer 108 of FIGS. 1a and 1b. However, contrary to the first embodiment of the present invention as depicted in FIGS. 1a and 1b, ferroelectric polymer layer 208 is not etched after deposition.

Referring next to FIG. 2b, a second conductive polymer layer 212 is shown as having been provided on layer 208. Above electrode layer 208 is a second electrode layer 216. Also disposed above layer 208 is a third ILD layer 214. Layers 212, 214 and 216 may, respectively, comprise the same materials and be made in the same manner as layers 112, 114, and 116 described above in relation to the first embodiment of the present invention as depicted in FIGS. 1a and 1b.

Advantageously, etching layer 108 in FIGS. 1a and 1b would result in improved planarity of the ferroelectric device, while not etching layer 208 in FIGS. 2a and 2b would avoid additional processing steps and complexity of the ferroelectric cell.

Figure 4:
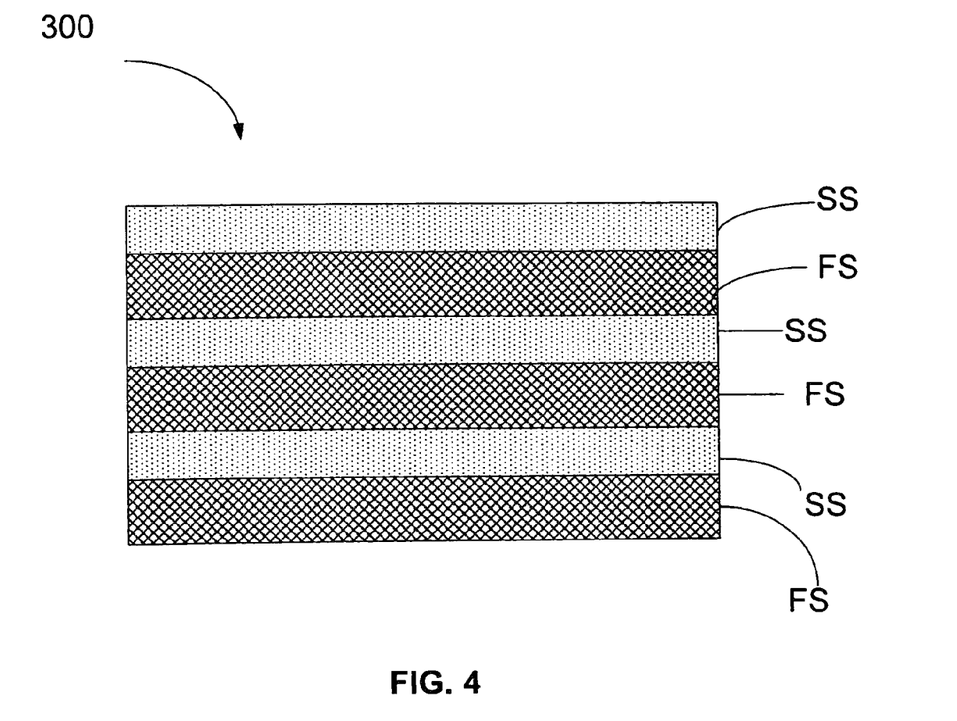
FIG. 4 is a schematic depiction of a ferroelectric memory device according to an embodiment of the present invention.

As apparent from FIGS. 1a and 1b on the one hand, and from FIGS. 2a and 2b on the other hand, the resulting ferroelectric memory module 100/200 may include a first set of layers FS and a second set of layers SS as indicated on those figures, sets FS and SS disposed with respect to one another such that their trenches, electrode layers and conductive polymer sublayers are respectively substantially perpendicular with respect to one another and formed to contain an array of cross point memory cells. According to embodiments of the present invention, number of modules 100/200 may be stacked above one another to form a multilayer system or multilayer memory device 300 as shown in FIG. 4, memory device 300 including multiple sets of layers FS and SS stacked above one another, each of the sets FS or SS being formed in the same manner as described herein with respect to FIGS. 1a and 1b on the one hand, and to FIGS. 2a and 2b on the other hand. It is to be noted that each respective set of layers FS in memory device 400 may be different from one or more of the other sets of layers FS in the same system, either in terms of the material used for a given layer in the set of layers FS, and/or in terms of the manner in which a given layer in the set of layers FS is formed. It is therefore not necessary that each set of layers FS in memory device 400 be identical to the other set of layers FS in the system. In addition, similarly, each respective set of layers SS in memory device 400 may be different from one or more of the other sets of layers SS in the same system, either in terms of the material used for a given layer in the set of layers SS, and/or in terms of the manner in which a given layer in the set of layers SS is formed. It is therefore not necessary that each set of layers SS in memory device 400 be identical to the other set of layers SS in the system. In addition, it is possible according to embodiments of the present invention, for memory device 400 to include one or more FS layers according to module 100, and one or more FS layers according to module 200. A system such as memory device 400 may be configured for use in a device such as wireless device 170 of FIG. 7, which will be explained in more detail hereinafter.

The electrodes in each respective layer of each module, that is 104 and 106 (module 100) or 204 and 206 (module 200), may be configured to be substantially parallel to each other as suggested by FIGS. 1a and 1b on the one hand, and 2a and 2b on the other hand. Additionally, for a given module, the first and second electrode layers may be configured such that they are substantially perpendicular to each other. Each set of first and second electrode layers of a given module may further, as shown, be configured to include a ferroelectric polymer layer therebetween. The cross over point, or intersection, of a first and second layer electrode may form a memory cell, as readily recognizable by a person skilled in the art. This memory cell may be capable of holding a particular polarization, which may cause the memory cell to hold a representative value such as a '1' or a '0', for example, although the claimed subject matter is not limited to a memory cell that represents only 2 states. Additionally, it is important to note that embodiments of the present invention are not limited to a memory array with any particular number of memory cells, or to a device with only two electrode layers.

Referring next to FIGS. 3a-3i, primary stages in the fabrication of a memory module 100 or 200 according to either a first or a second embodiment of the present invention are depicted. In particular, it is noted that these primary stages of fabrication apply equally as well to the embodiment of FIGS. 1a and 1b on the one hand, and to the embodiment of FIGS. 2a and 2b on the other hand. As a result, when referring to various layers, reference will be made in the following description and in FIGS. 3a-3i to specific layers in both the first embodiment and the second embodiment of the present invention in the alternative, as in, for example, layer 102/202, meaning that reference is being made to either of layer 102 of the first embodiment, or to layer 202 of the second embodiment. It is further noted that in the following description, what is meant by "material," such as "ILD material," "conductive polymer material" and "ferroelectric polymer material" is a layer after deposition and before further processing of the layer.

Figure 3A:
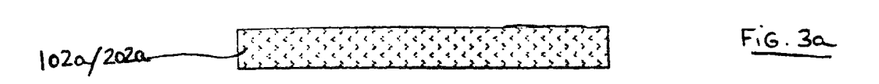
FIGS. 3a-3i are cross-sectional views of primary stages of fabrication of a ferroelectric memory module according to an embodiment of the present invention.
Figure 3B:
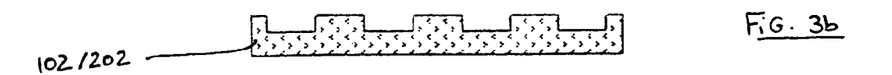
Figure 3C:
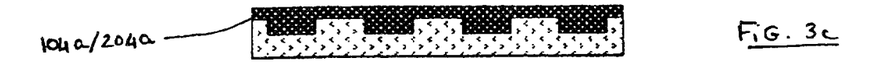
Figure 3D:
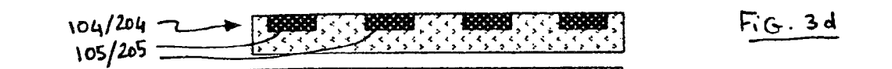
Figure 3E:
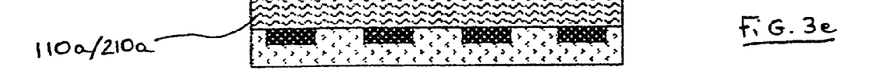
Figure 3F:
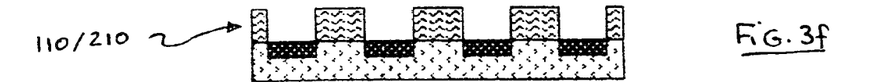
Figure 3G:
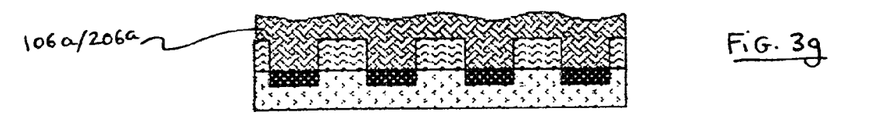
Figure 3H:
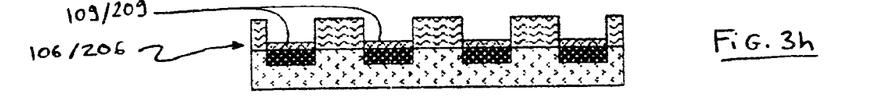
Figure 3I:
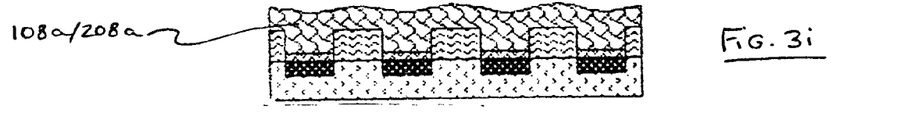

As seen in FIG. 3a, a method of fabricating a memory module according to embodiments of the present invention involves the deposition of an ILD material 102a/202a on a substrate, such as, by way of example, a silicon substrate having metal contacts to active transistors for addressing the cross-point array of memory cells. As shown in FIG. 3b, ILD material 102a/202a may undergo lithography and etching according to industry standards to yield ILD layer 102/202 defining trenches therein. As noted previously with respect to ILD layer 102/202 of FIGS. 1a and 1b or of FIGS. 2a and 2b, that layer may be made of Silicon Oxide ($Si_xO_y$), Silicon oxy-fluoride ($Si_xO_yF_z$), Silicon oxy-nitride ($Si_xO_yN_z$), Silicon Nitride ($Si_xN_y$), Nitrogen doped Silicon Carbide ($Si_xC_yN_z$), Silicon Caribe ($Si_xC_y$), Polymers ($C_vH_wF_xO_yN_z$). ILD layer 102/202 may be formed, by way of example, using well known deposition processes, such as chemical vapor deposition (CVD), sputter deposition, plasma vapor deposition (PVD), spin casting from solution, followed by lithography and etch techniques. Thereafter, as seen in FIG. 3c, a first metal material 104a/204a is deposited onto ILD layer 102/202, and may be made of titanium nitride (TiN) or tantalum nitride (TaN), or composites of various metals and alloys of Ti, Ta, Ni, Al, Cu, Au, Ag, Pt, and may be formed using well known deposition processes, such as CVD, sputtering, PVD, atomic layer deposition (ALD), electroplating, or electro-less plating, followed by chemical mechanical polishing (CMP). Material 104a/204a at FIG. 3d may, by way of example, undergo a CMP process in order to polish away parts of the same to yield electrode layer 104/204 comprising a plurality of electrodes 105/205 as shown. As next seen in FIG. 3e, a second ILD layer 110a/210a may be deposited above layers 102/202 and 104/204 as shown. As shown in FIG. 3f, ILD layer 110a/210a may undergo lithography and etching according to industry standards to yield ILD layer 110/210 defining trenches therein. As noted previously with respect to ILD layer 110/210 of FIGS. 1a and 1b or of FIGS. 2a and 2b, that layer may be made of the same material/materials and deposited in the same manner as ILD layer 102/202. Subsequent to lithography and etching of ILD layer 110/210, as seen in FIG. 3g, a conductive polymer material 106a/206a is deposited onto layers 102/202 and 104/204, for example using well known spinning techniques. As per FIG. 3h, conductive polymer material 106a/206a may be etched using any of well known dry etch techniques to yield conductive polymer layer 106/206 including a plurality of conductive polymer sublayers 109/209 as shown. As noted previously with respect to conductive polymer layer 106/206 of FIGS. 1a and 1b, that layer may be made of Poly (ethylene-dioxythiophene) (PEDOT), Poly Pyrrole (PPY), poly(aniline) PANI, or any available conducting polymer with a resistivity below 1E5 ohm-cm, and may be formed, by way of example, using well known spin deposition processes followed by a dry etch to reduce the thickness of the polymer layer. Thereafter, as seen in FIG. 3i, a ferroelectric polymer material 108a/208a is deposited onto the layers 106/206 and 110/210 as shown. By way of example, material 108a/208a may be deposited using well known spinning techniques. As noted previously with respect to conductive polymer layer 108/208 of FIGS. 1a and 1b or of FIGS. 2a and 2b, layers 108a/208a may be made of a copolymer of vinyledene fluoride (VDF) and triflouroethylene (TrFE), or other organic spin-processable ferroelectric polymer such as pure polyVDF, and may, by way of example, be deposited by well known spin deposition processes. As apparent from FIGS. 3a to 3i, those figures respectively represent primary stages of fabrication of a memory module according at least to either the first or the second embodiment of the present invention.

Figure 3J:
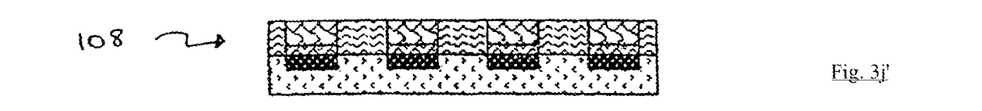
FIGS. 3j'-3q' are cross-sectional views of final stages of fabrication of a ferroelectric memory module according to a first embodiment of the present invention.

As seen in FIGS. 3*j*'-3*q*', final stages in the fabrication of a memory module 100 according to the first embodiment of the present invention as seen in FIGS. 1*a* and 1*b* are depicted. In particular, it is noted that the secondary stages of fabrication depicted in FIGS. 3*j*'-3*q*' apply to the embodiment of FIGS. 1*a* and 1*b*, and not to the embodiment of FIGS. 2*a* and 2*b*. Secondary stages in the fabrication of a memory module 200 according to the second embodiment of the present invention as seen in FIGS. 2*a* and 2*b* are depicted in FIGS. 3*j*"-3*p*", and are described later in the instant description.

Figure 3K:
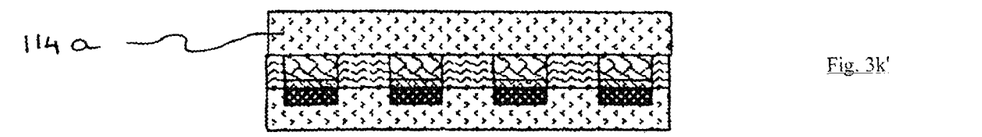
Figure 3L:
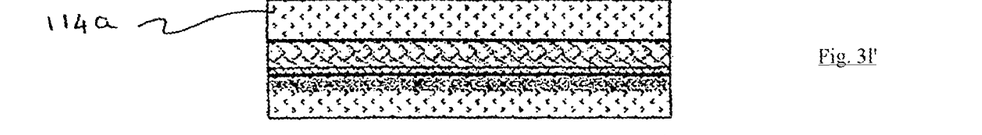
Figure 3M:
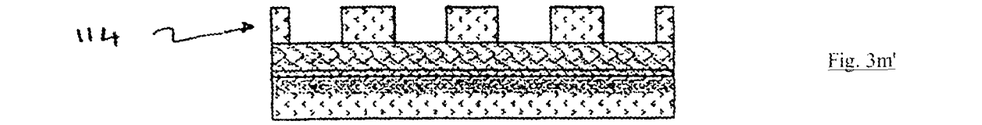
Figure 3N:
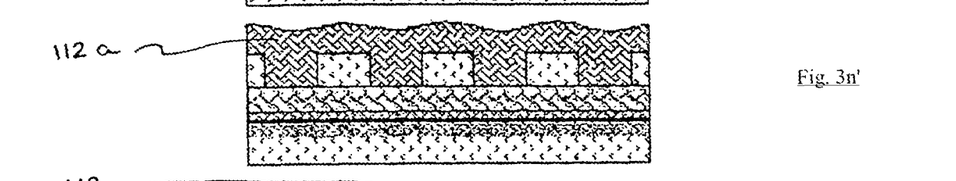
Figure 3O:
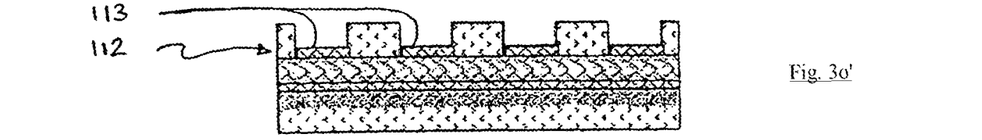
Figure 3P:
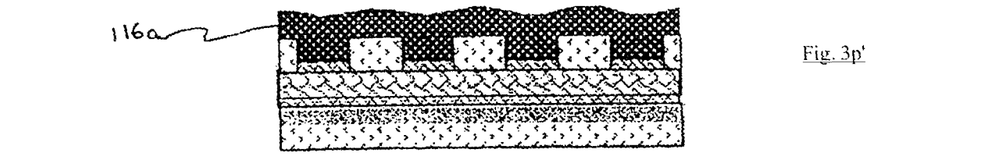
Figure 3Q:
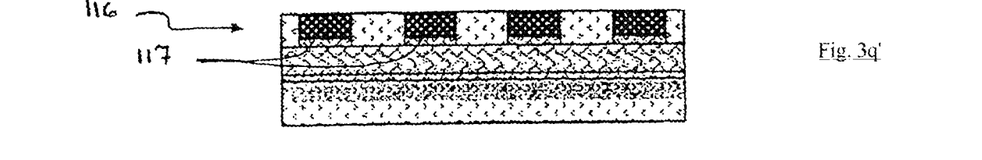

Referring then to FIG. 3*j*', ferroelectric polymer material 108*a* deposited as shown in FIG. 3*i* may be etched according to a first embodiment of the present invention to yield ferroelectric polymer layer 108 as shown. As described above with respect to layer 108, that layer may be made of a copolymer of vinyledene fluoride (VDF) and triflouroethylene (TrFE), or other organic spin-processable ferroelectric polymer such as pure polyVDF, and may be etched to be planarized. Referring next to FIGS. 3*k*' and 3*l*', a third ILD material 114*a* may be deposited onto layers 108 and 110. FIGS. 3*k*' and 3*l*' are elevational cut-away views respectively depicting cut-aways at sides of the partially fabricated module, the sides being disposed at 90 degrees with respect to one another. As shown in FIG. 3*m*', ILD material 114*a* may undergo lithography and etching according to industry standards to yield ILD layer 114. As noted previously with respect to ILD layer 114 of FIGS. 1*a* and 1*b*, that layer may be made of the same materials as those listed for ILD layers 102/110 above. Layer 114 may be patterned through lithography, etch and clean, again similar to layers 102/110. Subsequent to lithography and etching of ILD layer 114, as seen in FIG. 3*n*', a conductive polymer material 112*a* is deposited onto layer 114, for example using well known spinning techniques. As per FIG. 3*o*', conductive polymer material 112*a* may be etched using any of well known dry etch techniques to yield conductive polymer layer 112 including conductive polymer sublayers 113 as shown. As noted previously with respect to conductive polymer layer 112 of FIGS. 1*a* and 1*b*, that layer may be made of Poly (ethylene-dioxythiophene) (PEDOT), Poly Pyrrole (PPY), poly(aniline) PANI, or any available conducting polymer with a resistivity below 1E5 ohm-cm, and may be formed, by way of example, using well known spin deposition processes followed by a dry etch to reduce the thickness of the polymer layer. Thereafter, as seen in FIG. 3*p*', a second metal material 116*a* is deposited onto conductive polymer layer 112, and may be made of the same materials and deposited in same manner as layer 104. Material 116*a* at FIG. 3*q*' may, by way of example, undergo a CMP process in order to polish away parts of the same to yield electrode layer 116 comprising a plurality of electrodes 117 as shown. It is noted that FIG. 3*q*' corresponds to FIG. 1*b*, and shows a module 100 according to a first embodiment of the present invention.

Final stages in the fabrication of a memory module 200 according to the second embodiment of the present invention as seen in FIGS. 2*a* and 2*b* are depicted in FIGS. 3*j*"-3*q*", and are described below.

Referring then to FIG. 3*j*", ferroelectric polymer material 208*a* deposited as shown in FIG. 3*i* is not etched according to a second embodiment of the present invention and corresponds to ferroelectric polymer layer 208 as shown. As described above with respect to layer 208, that layer may be made of the same material/materials as layer 108 described above. Referring again to FIGS. 3*j*" and 3*k*", a third ILD material 214*a* may be deposited onto layers 208 and 210. FIGS. 3*j*" and 3*k*" are elevational cut-away views respectively depicting cut-aways at sides of the partially fabricated module, the sides being disposed at 90 degrees with respect to one another. As shown in FIG. 3*l*'", ILD material 214*a* may undergo lithography and etching according to industry standards to yield ILD layer 214 defining trenches therein. As noted previously with respect to ILD layer 214 of FIGS. 2*a* and 2*b*, that layer may be made of the same material/materials as layer 114 described above. Subsequent to lithography and etching of ILD layer 214, as seen in FIG. 3*m*", a conductive polymer material 212*a* is deposited onto layer 214, for example using well known spinning techniques. As per FIG. 3*n*", conductive polymer material 212*a* may be etched using any of well known dry etch techniques to yield conductive polymer layer 212 including conductive polymer sublayers 213 as shown. As noted previously with respect to conductive polymer layer 212 of FIGS. 2*a* and 2*b*, that layer may be made of the same material/materials as layer 112 described above. Thereafter, as seen in FIG. 3*o*", a second metal material 216*a* is deposited onto conductive polymer layer 212, and may be made of the same material/materials as layer 116 described above, and may be deposited in the same manner. Material 216*a* at FIG. 3*p*" may, by way of example, undergo a CMP process in order to polish away parts of the same to yield electrode layer 216 comprising a plurality of electrodes 217 as shown. It is noted that FIG. 3*p*" corresponds to FIG. 2*b*, and shows a module 200 according to a first embodiment of the present invention.

Advantageously, embodiments of the present invention provide an integration scheme to produce an organic ferroelectric memory device having one or more memory modules with conductive organic polymer electrodes disposed on each side of an active ferroelectric polymer memory layer. The integration scheme according to embodiment of the present invention uses multiple organic spin and etch processes to fill a single Damascene ILD trench with conducting polymer electrodes and active ferroelectric polymer. The resulting memory module according to embodiments of the present invention provides at least one of: (1) a reaction barrier in the form of the conducting polymer layers which substantially isolate and protect the ferroelectric polymer from reaction with the inorganic metal electrode, preventing a direct reaction of the metal in the electrodes and the ferroelectric polymers; and (2) a diffusion barrier also in the form of the conducting polymer layers which substantially prevent diffusion of metal from the inorganic metal electrodes to the ferroelectric polymer layer after the device is processed and/or fatigued. Thus, the conducting polymer layers of a module according to embodiments of the present invention provide a reaction and/or diffusion barrier between the inorganic electrodes and the ferroelectric polymer layer.

As set forth previously, subtractive metal integration schemes of the prior art cannot support the patterning of conductive polymer electrodes on the bottom of the ferroelectric polymer. Thus, current subtractive metal integration schemes disadvantageously allow direct contact between the inorganic metal layer of the electrodes and the ferroelectric polymer layer, which contact can result in reactions that tend to degrade the performance of the ferroelectric polymer. The reaction and/or diffusion barrier provided by the conducting polymer layers in each memory module according to embodiments of the present invention advantageously prevent such reactions, and hence lead to an improvement in the performance of the memory module.

According to embodiments of the present invention, conducting polymer electrodes are used in conjunction with ferroelectric polymers to fabricate memory modules. A single damascene patterning (that is, patterning of ILD trench with either metal and/or polymer) and backfill with organic spin (that is, either the conductive polymer or the ferroelectric polymer depending on the layer) on layers is performed to provide the conductive polymer layer on each electrode layer. Advantageously, embodiments of the present invention result in memory modules exhibiting improved performance.

Figure 5:
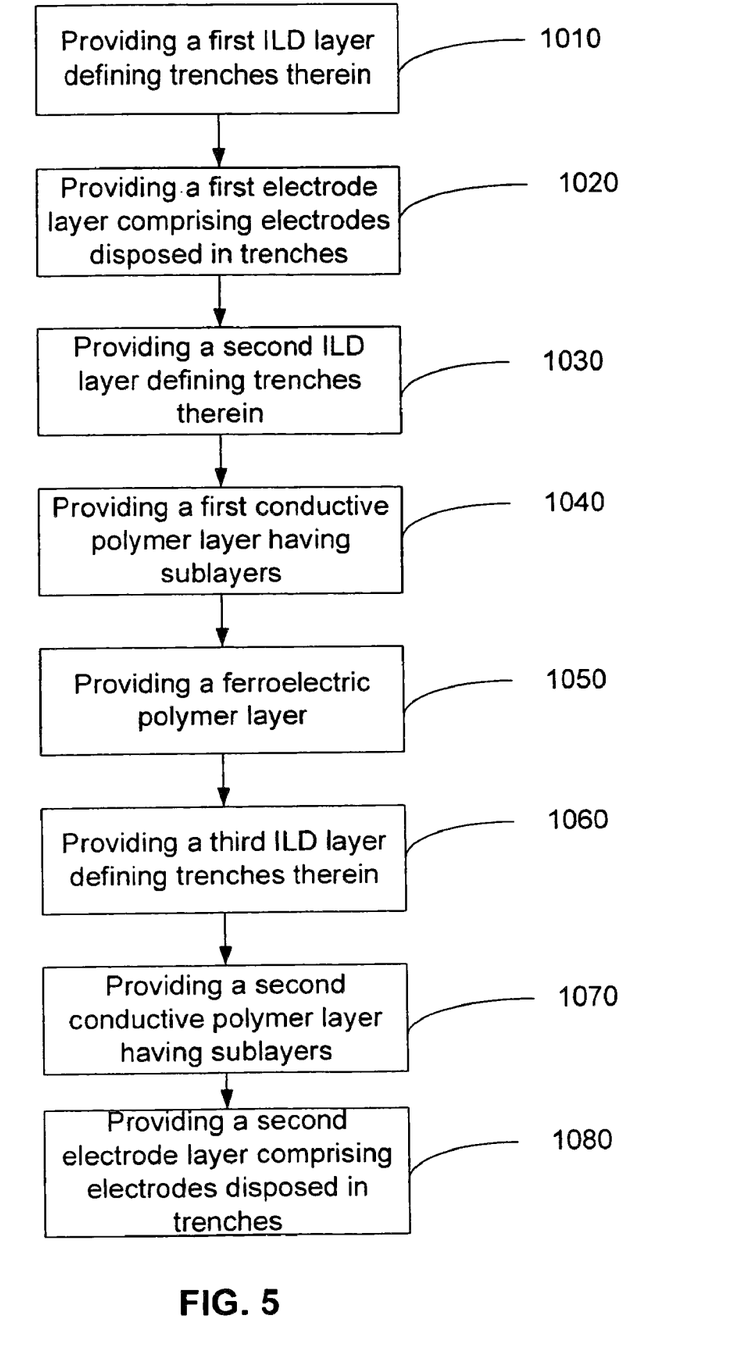
FIG. 5 is a flow diagram of a method of fabricating a memory module according to an embodiment of the present invention.

Referring next to FIG. 5, a flow diagram is depicted showing various stages of fabricating a ferroelectric memory module according to embodiments of the present invention. A method of fabricating a ferroelectric memory device according to embodiments of the present invention, as shown in FIG. 5, involves: at block 1010, providing a first ILD layer defining trenches therein; at block 1020 providing a first electrode layer comprising electrodes disposed in the trenches of the first ILD layer; at block 1030, providing a second ILD layer defining trenches therein in registration with electrodes of the first electrode layer; at block 1040, providing a first conductive polymer layer comprising a plurality of conductive polymer sublayers disposed above each of the electrodes of the first electrode layer; at block 1050, providing a ferroelectric polymer layer on a combination comprising the first ILD layer, the second ILD layer, the first electrode layer and the first conductive polymer layer; at block 1060, providing a third ILD layer above the ferroelectric polymer layer, the third ILD layer defining trenches therein; at block 1070, providing a second conductive polymer layer comprising a plurality of conductive polymer sublayers disposed in each of the trenches of the third ILD layer; at block 1080, providing a second electrode layer comprising a electrodes disposed in the trenches of the third ILD layer on the sublayers of the second conductive polymer layer.

Figure 6:
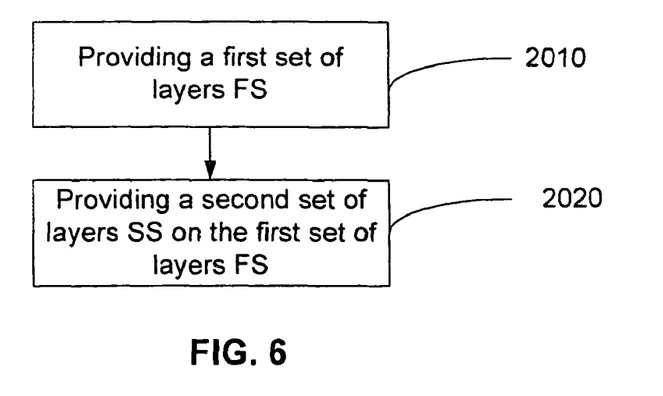
FIG. 6 is a flow diagram of a method of fabricating a memory module according to an embodiment of the present invention.

Referring next to FIG. 6, a method of fabricating a ferroelectric memory module according to embodiments of the present invention includes: at block 2010, providing a first set of layers FS comprising an ILD layer defining trenches therein; a first electrode layer disposed in the trenches of the ILD layer; a first conductive polymer layer disposed on the first electrode layer; and a ferroelectric polymer layer disposed on the first conductive polymer layer; and, at block 2020, providing a second set of layer SS on the first set of layers FS, the second set of layers SS comprising a second set of layers disposed on the first set of layers to define memory cells therewith, the second set of layers including: a ILD layer defining trenches therein; a second conductive polymer layer disposed in the trenches of the ILD layer of the second set of layers; a second electrode layer disposed on the second conductive polymer layer. The first conductive polymer layer and the second conductive polymer layer cover or isolate the electrode layers with respect to the ferroelectric polymer layer to provide a reaction and/or diffusion barrier between the electrode layers and the ferroelectric polymer layer. By "reaction and/or diffusion barrier," what is meant in the context of the present invention is a barrier disposed between either one of the electrode layers on the one hand and the ferroelectric polymer layer on the other hand to substantially prevent a reaction of the electrode layer being covered and the ferroelectric polymer layer, and/or to substantially prevent diffusion of metal from the electrodes to the ferroelectric polymer layer.

Figure 7:
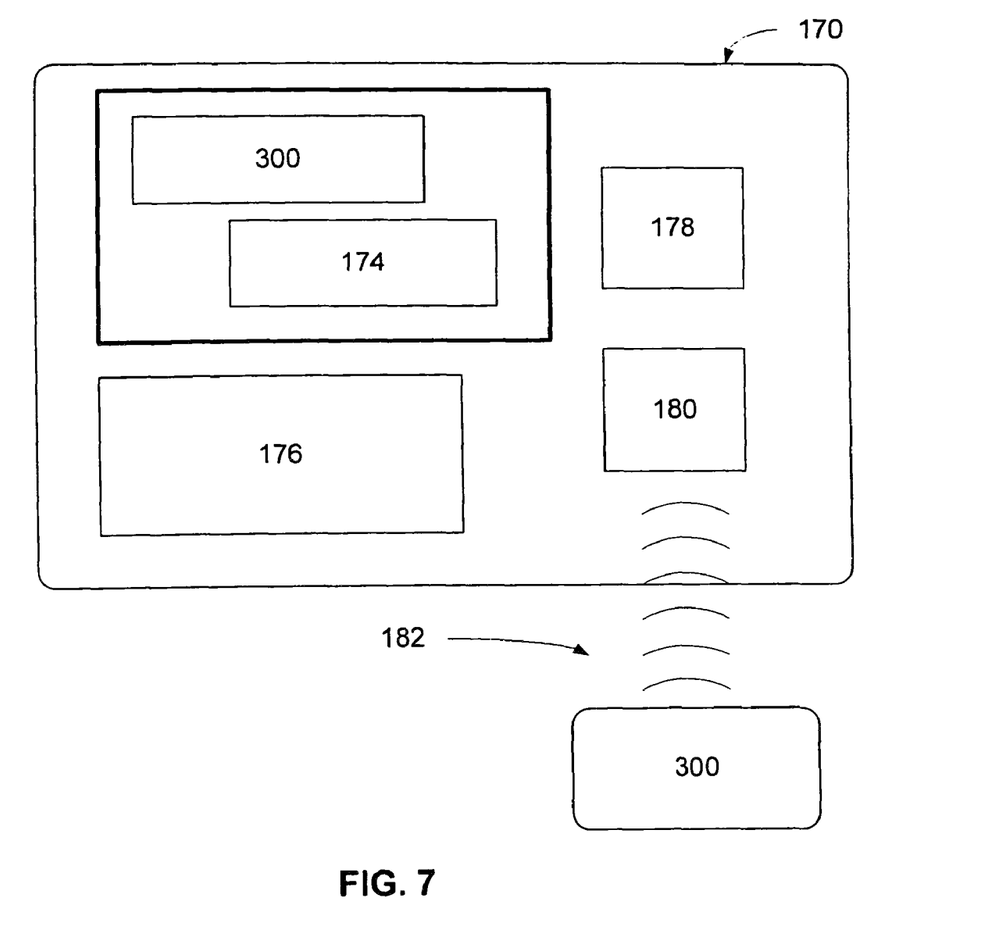
FIG. 7 is a block diagram showing a system incorporating a ferroelectric memory device according to an embodiment of the present invention.

FIG. 7 is provided to illustrate an example of a system 90 for memory device 300 such as memory device 300 of FIG. 4, in accordance with one embodiment of the present invention. In this particular embodiment, a device such as device 300 may, for example, be used as a stand alone memory that is used in a portable communication device 170, which may comprise, for example, a mobile communication device (e.g., cell phone), a two-way radio communication system, a one-way pager, a two-way pager, a personal communication system (PCS), a portable computer, or the like. Alternatively, memory device 300 may be used in applications that are not regarded as mobile such as desktop computing systems, although it is important to note that these are exemplary embodiments, and the claimed subject matter is not so limited. Wireless computing device 172 may comprise a processor 174 to execute instructions and comprise a microprocessor, a central processing unit (CPU), a digital signal processor, a microcontroller, a reduced instruction set computer (RISC), a complex instruction set computer (CISC), or the like. Wireless computing device 172 may also optionally include a display 176 to display information to a user, and a transceiver 178 and antenna 180 to provide wireless communication.

It should also be understood that the scope of the claimed subject matter is not limited to stand alone memories. In alternative embodiments, memory device 300 may be formed within or embedded in other components of wireless computing device 170 such as in processor 174. In this embodiment, application or system 90 may comprise a device 184, which may be capable of receiving transmissions from antenna 180. Transmissions may be transmitted by use of wireless communications media 182, for example. It is important to note, however, that application 90 is an exemplary embodiment of one use of a ferroelectric device in accordance with the claimed subject matter.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A ferroelectric polymer memory module comprising:
a first set of layers including: a first ILD layer defining trenches therein; a first electrode layer disposed in the trenches of the first ILD layer; a first conductive polymer layer disposed on the first electrode layer and in the trenches of the first ILD layer; and a ferroelectric polymer layer disposed on the first conductive polymer layer, in and extending beyond the trenches of the first ILD layer; and
a second set of layers disposed on the first set of layers to define memory cells therewith, the second set of layers including: a second ILD layer defining trenches therein; a second conductive polymer layer disposed in the trenches of the second ILD layer; and a second electrode layer disposed on the second conductive polymer layer;
wherein the first conductive polymer layer and the second conductive polymer layer cover the first and second electrode layers and separate the first and second electrode layers from the ferroelectric polymer layer to provide a reaction barrier and/or diffusion barrier between the first and second electrode layers and the ferroelectric polymer layer.

2. The memory module of claim 1, wherein the first ILD layer comprises:
a first portion defining trenches therein; and
a second portion defining trenches therein and disposed on the first portion such that its trenches are in registration with the trenches of the first portion, the first electrode layer being disposed in trenches of the first portion.

3. The memory module of claim 1, wherein the trenches, the first electrode layer and the first conductive polymer layer of the first set of layers are substantially perpendicular to, respectively, the trenches, and the first electrode layer and the second conductive polymer layer of the second set of layers.

4. The memory module of claim 1, wherein the ILD layer of the first set of layers and the ILD layer of the second set of layers each comprise one of Silicon Oxide ($Si_xO_y$), Silicon oxy-fluoride ($Si_xO_yF_z$), Silicon oxy-nitride ($Si_xO_yN_z$), Silicon Nitride ($Si_xN_y$), Nitrogen doped Silicon Carbide ($Si_xC_yN_z$), Silicon Carbide ($Si_xC_y$), or Polymers ($C_vH_wF_xO_yN_z$).

5. The memory module of claim 1, wherein the first conductive polymer layer and the second conductive polymer layer each comprise one of Poly (ethylene-dioxythiophene) (PEDOT), Poly Pyrrole (PPY), Poly (aniline) PANI, or any conducting polymer with a resistivity below $1\times10^5$ ohm-cm.

6. The memory module of claim 1, wherein the ferroelectric polymer layer comprises one of a copolymer of vinyledene fluoride (VDF) and triflouroethylene (TrFE), pure poly VDF, or another organic spin-processable ferroelectric polymer.

7. The memory module of claim 1, wherein the first electrode layer and the second electrode layer each comprise one of titanium nitride (TiN), tantalum nitride (TaN), or composites of various metals and alloys of Ti, Ta, Ni, Al, Cu, Au, Ag, Pt.

* * * * *